(12) United States Patent
Seshan

(10) Patent No.: US 7,511,370 B2
(45) Date of Patent: *Mar. 31, 2009

(54) POWER GRIDDING SCHEME

(75) Inventor: Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 536 days.

This patent is subject to a terminal disclaimer.

(21) Appl. No.: 11/203,724

(22) Filed: Aug. 15, 2005

(65) Prior Publication Data
US 2006/0033197 A1   Feb. 16, 2006

Related U.S. Application Data

(62) Division of application No. 10/680,772, filed on Oct. 7, 2003, now Pat. No. 6,930,379, which is a division of application No. 10/022,700, filed on Oct. 30, 2001, now Pat. No. 6,979,896.

(51) Int. Cl.
*H01L 23/52* (2006.01)

(52) U.S. Cl. ........................ 257/691; 257/690; 257/734; 257/E23.153

(58) Field of Classification Search ......... 257/690–692, 257/734, 737, 738, E23.141, E23.142, E23.151, 257/E23.153
See application file for complete search history.

(56) References Cited

U.S. PATENT DOCUMENTS 6,930,379 B2 * 8/2005 Seshan ........................ 257/691

* cited by examiner

*Primary Examiner*—Matthew E Warren
(74) *Attorney, Agent, or Firm*—Trop, Pruner & Hu, P.C.

(57) ABSTRACT

An electrical device includes electrical contact pads, a supply voltage bus and an interconnection circuit. The electrical contact pads receive a supply voltage, and the bus is electrically connected to the electrical contact pads. For each electrical contact pad, the interconnection circuit forms a redundant connection between the bus and the electrical contact pad. The electrical device may include a passivation layer that includes windows to establish electrical contact between the electrical contact pads and the supply voltage bus. This window may be elongated in a path that is generally aligned with the path along which the supply voltage bus extends.

8 Claims, 6 Drawing Sheets

POWER GRIDDING SCHEME

This application is a divisional of Ser. No. 10/680,772, filed Oct. 7, 2003 U.S. Pat. No. 6,930,379, granted Aug. 16, 2005, which is a divisional of U.S. patent application Ser. No. 10/022,700, filed on Oct. 30, 2001 now U.S. Pat. No. 6,979,896.

BACKGROUND

The invention generally relates to a power gridding scheme.

Microprocessors are being fabricated with increasingly higher speeds and device density. As a result, the power that is consumed by a microprocessor continues to increase from one generation to the next. This increase in power usage, in turn, may present several challenges.

For example, the microprocessor has a finite number of external contacts (positive and negative supply voltage contacts, for example) to communicate power to the microprocessor. For example, these external contacts may be solder bumps that are part of a ball and grid package, a package in which the solder bumps are arranged in a rectangular grid, or array. In this array, the distances between adjacent solder bumps typically decreases from one generation microprocessor to the next in an attempt to increase the number of solder bumps that are available to communicate power. However, the increase in bump density does not track the corresponding increase in the speed and scaling of devices in the microprocessor. As a result, there is a net reduction in the number of solder bumps for power per device in the microprocessor. Thus, the net result of the increased power density for these solder bumps is that the current densities of some solder bumps may be large enough to possibly cause premature failure of these solder bumps due to the process of electromigration (EM).

Thus, there is a continuing need for an arrangement that addresses one or more of the problems that are stated above.

DETAILED DESCRIPTION

Figure 1:
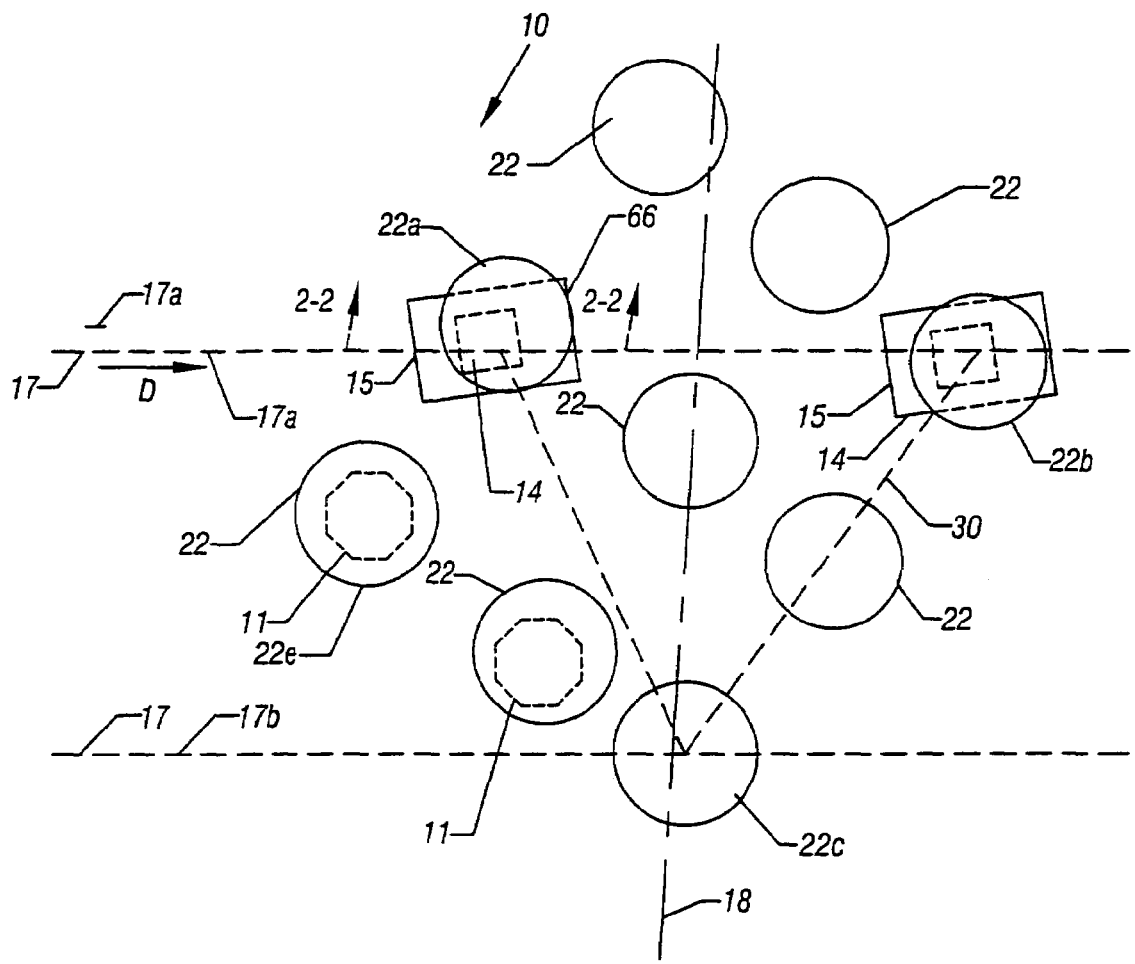
FIG. 1 is a partial schematic diagram of an integrated circuit package depicting an arrangement of solder bumps according to an embodiment of the invention.

Referring to FIG. 1, an integrated circuit package (a microprocessor, as an example) in accordance with an embodiment of the invention includes solder bumps 22 that are located on the outside of the package 10 to form external contacts. In this manner, the package 10 may be a ball grid package, and the solder bumps 22 may be part of a grid, or array. The solder bumps 22 form contacts for communicating power and signals to and from circuitry of the integrated circuit package 10. As an example, some of the solder bumps 22 may designated to communicate positive and negative supply voltages to the integrated circuit package 10.

More particularly, FIG. 1 depicts, as examples, specific solder bumps 22a, 22b and 22c (for example) that may be used to communicate power to various circuitry of the integrated circuit package 10. For this example, the solder bumps 22a, 22b and 22c may all communicate the same positive power supply voltage. The solder bumps 22a, 22b and 22c may be electrically connected to different internal power, or supply voltage, buses 17 of the integrated circuit package 10. In this manner, the solder bumps 22a and 22b may be electrically connected to one positive supply voltage bus 17a of the integrated circuit package 10, and the solder bump 22c may be electrically connected to another positive supply voltage bus 17b of the integrated circuit package 10.

Although the positive supply voltage buses 17 are described below in connection with the solder bumps 22a, 22b, and 22c, it is understood that the same principles apply for other supply voltage buses, such as a negative supply voltage bus 18, for example.

To establish both an electrical and mechanical connection between a particular solder bump 22 and circuitry inside the integrated circuit package 10, a window may be formed in a passivation layer of the semiconductor die that is encased in the package 10. This passivation layer forms an outer insulating layer of the die 11 and is located between the closest internal metal layer of the package 10 and the solder bumps 22. As a more specific example, referring also to FIG. 2, the integrated circuit package 10 may include a passivation layer 16 that generally covers an upper metal layer 62 (a metal six layer, as an example) of the die 11. The metal layer 62 is exposed for contact with the solder bumps 22 at several locations at which contact windows are formed in the passivation layer 16.

Figure 2:
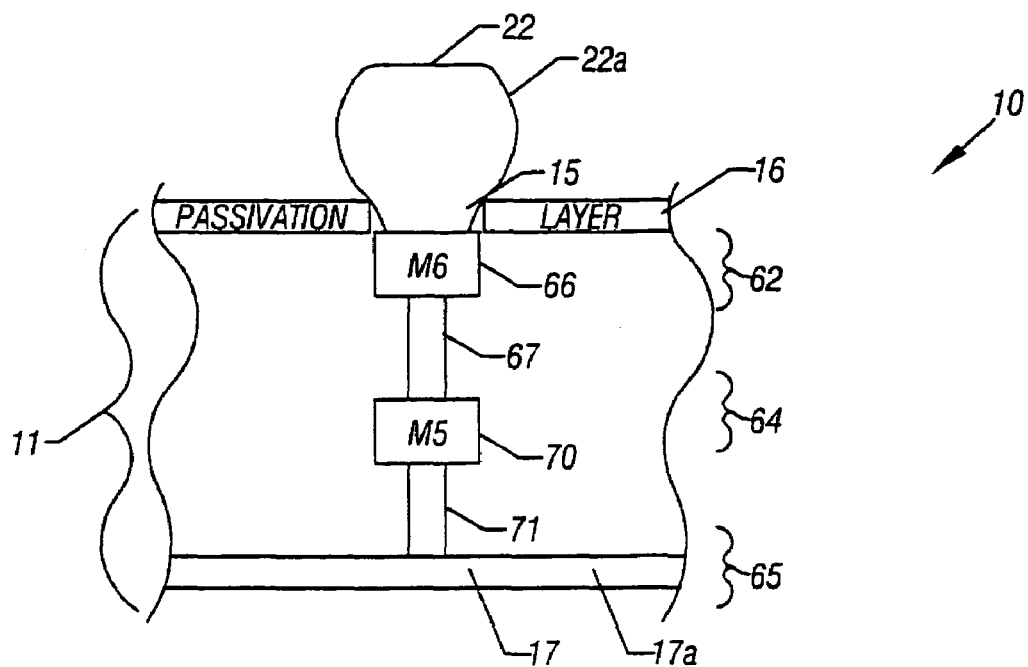
FIG. 2 is a cross-sectional view of the package taken along line 2-2 of FIG. 1.

One of these windows 15 is depicted in FIG. 2. As shown, the window 15 exposes a solder bump metal contact pad 66 that is part of the upper metal layer 62. Thus, the associated solder bump 22a extends through the window 15 to bond to the metal pad 66. This metal pad 66, in turn, is electrically connected to the supply voltage bus 17a, and thus, the contact of the solder bump 22a to the metal pad 66 electrically connects the solder bump 22a to the bus 17a. As an example of the interconnection between the metal pad 66 and the bus 17a, the pad 66 may be connected to a metal pad 70 of a lower metal layer 64 by way of a via 67, and this metal pad 70 may be connected to the bus 17 by way of another via 71.

The size of the window 15 limits the current carrying capability of the solder bump 22, as the size of the window 15 defines the area of the solder bump 22 that contacts the solder bump contact pad 66. For purposes of increasing the extent of contact between the solder bump 22 and the contact pad 66, in accordance with an embodiment of the invention, the window 15 is elongated. This elongation permits more contact area between solder bump 22 and its associated contact pad 66. Thus, selected windows of the integrated circuit package 10 may be elongated for purposes of increasing the current carrying capabilities of solder bumps 22 that communicate positive and negative supply voltages.

As a more specific example, referring back to FIG. 1, in some embodiments of the invention, the window 15 may be a substantially rectangular pad, a pad that is elongated such that the longest dimension of the window 15 is aligned with the bus 17 that lies underneath that window 15 and is electrically connected to the solder bump 22 that extends through the window 15. Thus, the major axis of the rectangular window 15 is aligned with and located directly above the bus 17 that extends immediately below the window 15.

In contrast to the elongated shape of the window 15, a window 14 of the prior art, also depicted in FIG. 1 for purposes of comparison, typically is square. In this manner, in conventional integrated circuits, the size of the square window is limited by the dimension (of the square window 14) that is transverse to the bus 17. In contrast, unlike conventional arrangements, in the integrated circuit 10, although the transverse direction governs the width of the window 15, the length of the window 15 is elongated along the bus 17 in a direction to permit more contact between the associated solder bump 22 and contact pad 66.

As a more specific example, in some embodiments of the invention, the window 15 may have a dimension of approximately 80 by 40 micrometers (μm, or microns), and in other embodiments of the invention may have dimensions of 100 by 150 microns.

It is noted that it is not essential that the window 15 has a rectangular shape. In this manner, in other embodiments of the invention, the window 15 may have different elongated shapes (an oval shape, for example).

As depicted in FIG. 1, in some embodiments of the invention, the windows that are formed in the passivation layer 16 are sized differently. In this manner, the windows, in some embodiments of the invention, are selectively sized, in that larger windows are formed for use with some solder bumps 22 and smaller windows are formed for use with other solder bumps 22. Such an arrangement permits larger windows to be formed for solder bumps 22 that carry relatively high levels of currents, thereby increasing the current carrying capabilities of these solder bumps 22; and permits smaller windows to be formed for solder bumps 22 that do not carry such high levels of current.

As an example of this selective sizing, FIG. 1 depicts the rectangular windows 15 that are relatively large and are used to increase the current carrying capabilities of solder bumps 22a and 22b, as compared to hexagonal windows 11 that are used by solder bumps 22d and 22e. The hexagonal window 11 is smaller than the window 15 in that the window 11 exposes less area of the upper metal layer for contact with the associated solder bump 22 than the window 15. Thus, the solder bumps 22d and 22e may be associated with lower currents than the solder bumps 22a and 22b, for example, and the sizes of their associated windows reflect this lower current load.

In some embodiments of the invention, as an example of this selective sizing, some of the windows may be approximately square and have dimensions of approximately 40 by 40 microns; and other larger windows (sized to impart a higher current capability to their associated solder bumps 22) may have dimensions of approximately 80 by 40 microns. As another example, in other embodiments of the invention, some of the windows may be approximately square and have dimensions of approximately 100 by 100 microns; and other larger windows (sized to impart a higher current capability to their associated solder bumps 22) may have dimensions of approximately 100 by 150 microns. Other variations, size differences and shapes of the windows are contemplated and are within the scope of the appended claims.

Figure 3:
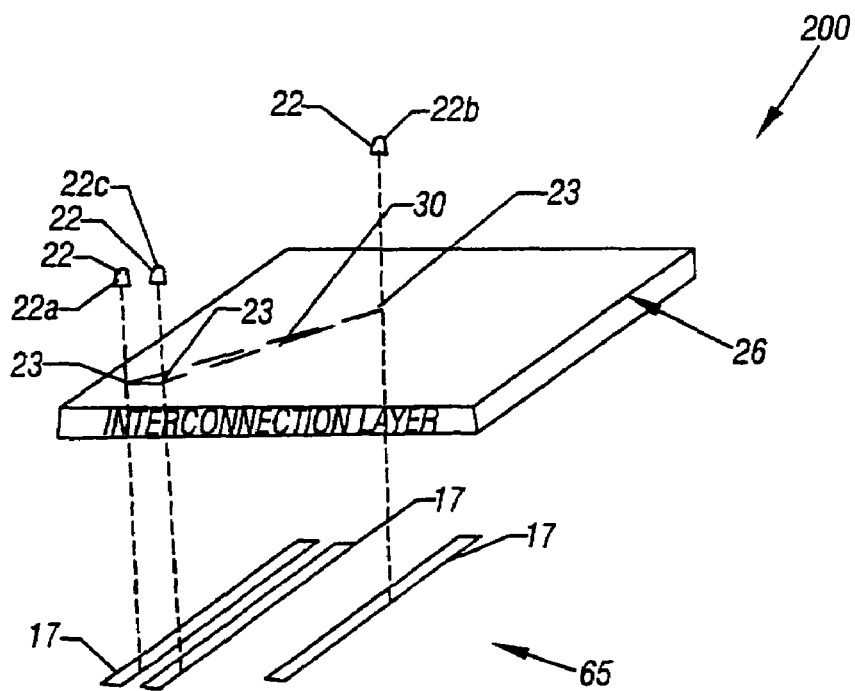
FIG. 3 is an exploded perspective view of a portion of the package according to an embodiment of the invention.
Figure 4:
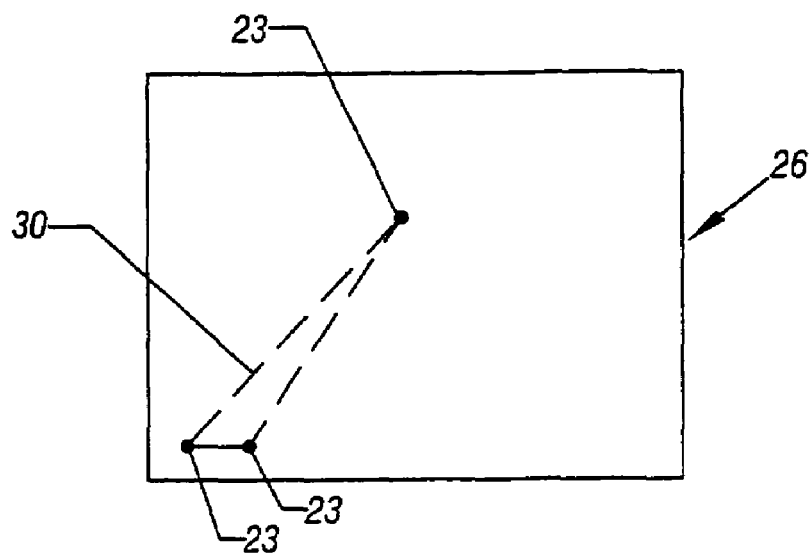
FIG. 4 is a top view of an interconnection layer of FIG. 3 according to an embodiment of the invention.

FIG. 3 depicts another embodiment 200 for the integrated circuit package. In this embodiment, the package 10 includes different features to increase the current carrying capability of the solder bumps 22. In this arrangement, the integrated circuit 10 includes an interconnection layer 26 to establish separate and redundant connections between the solder bumps 22 and the buses 17. For example, in some embodiments of the invention, the interconnection layer 26 may form bridges (such as bridges that form a triangle 30, as more clearly depicted in a top view in FIG. 4) that form redundant connection points 23 between the solder bumps 22a, 22b and 22c. As depicted in FIG. 3, these bridges may be part of a metal layer that is located between the solder bumps 22 and a metal layer in which the buses 17 are formed. However, in other embodiments of the invention, the interconnection layer 26 may be formed out of the same metal layer as the buses 17.

Figure 5:
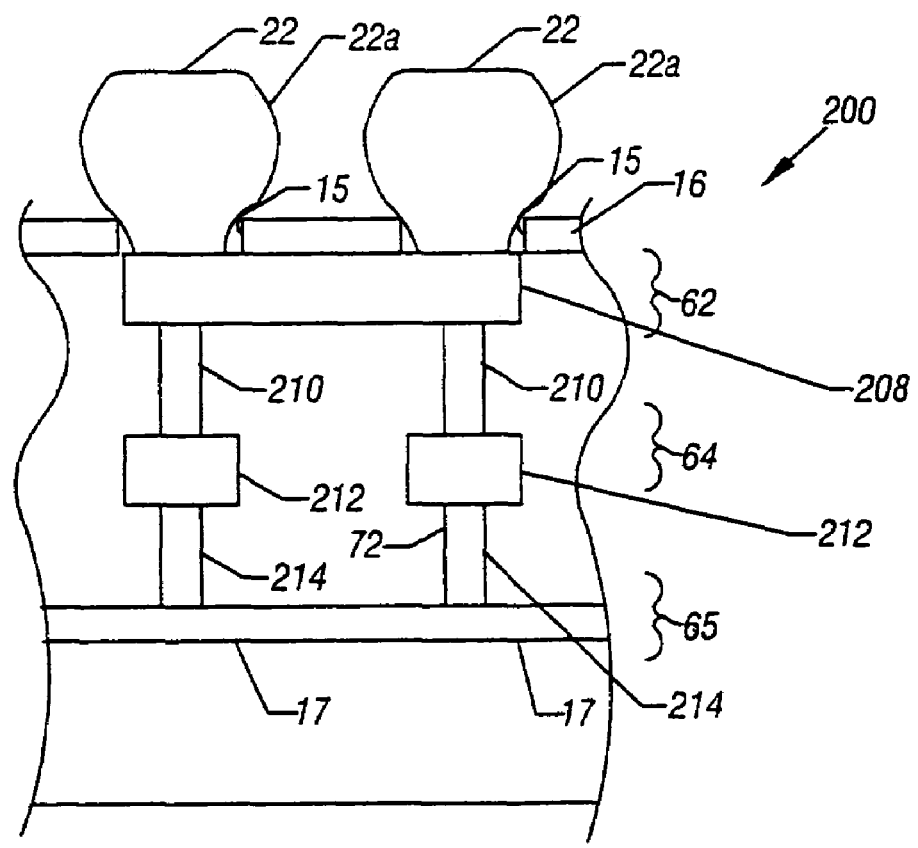
FIG. 5 is a cross-sectional view of a semiconductor package according to an embodiment of the invention.

FIG. 5 depicts a cross-sectional view of the integrated circuit 200, depicting the interconnection layer 26 as being part of the upper metal layer 62. More particularly, FIG. 5 depicts a portion 208 of the metal layer 62 that forms redundant connections between solder bumps 22 (two solder bumps 22 being depicted in FIG. 5). In this manner, each solder bump 22 is also connected to the bus 17 that is formed in the lower level metal layer 65. The integrated circuit 200 may have additional metal layers that are disposed between the metal layers 62 and 65, such as a metal layer 64 that is depicted in FIG. 5. In this manner, the metal layer 64 may include metal pads 212 that are connected to the metal portion 208 through vias 210, and the metal pads 212 may be connected to the bus 17 through other vias 214.

Figure 7:
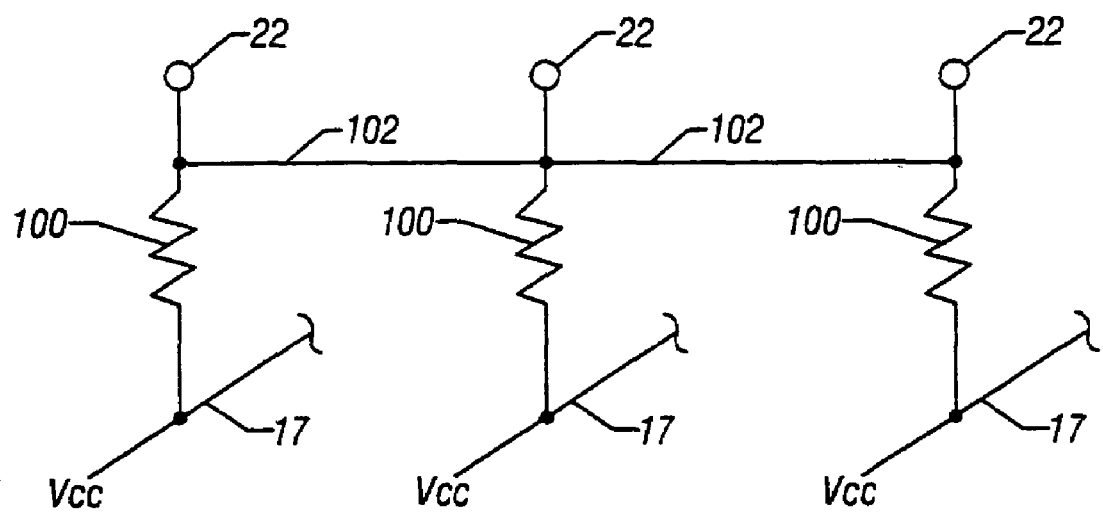
FIG. 7 is a schematic diagram depicting electrical connections between buses and solder bumps according to an embodiment of the invention.

Referring to FIG. 7, the electrical path between a solder bump 22 for a supply voltage and the corresponding bus 17 may be electrically represented by a resistor 100. However, unlike conditional arrangements, the interconnection layer 26 forms redundant connections (depicted by the electrical connections 102 between the solder bumps 22), thereby effectively shorting the solder bumps 22 together near the top of the die to form a lower resistance between each solder bump 22 and its associated bus 17.

Figure 6:
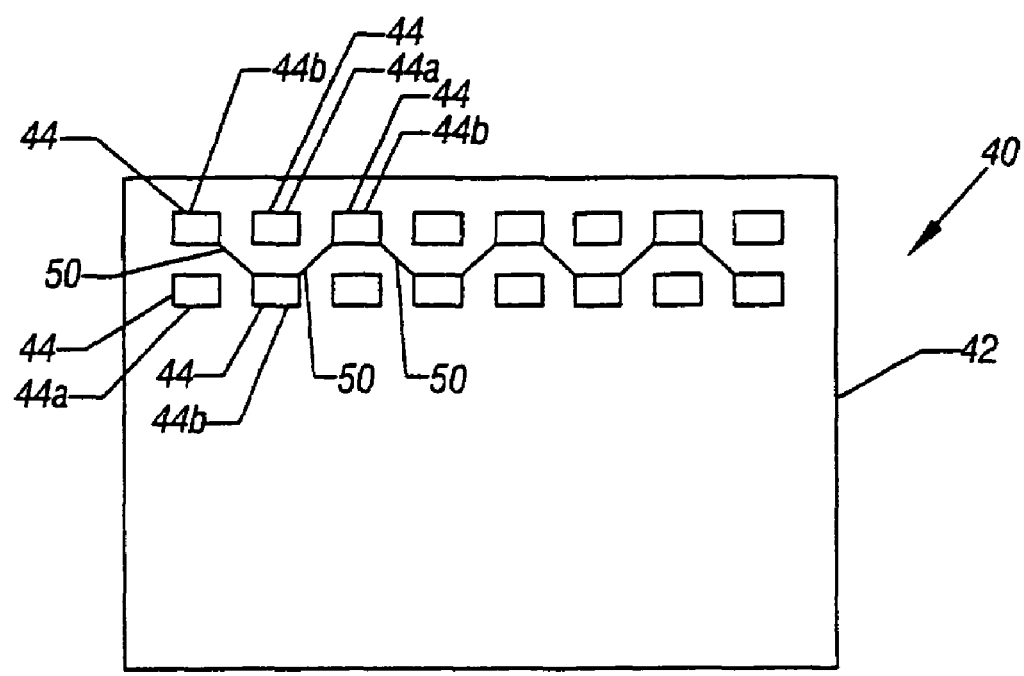
FIG. 6 is a top view of an integrated circuit die according to an embodiment of the invention.

Although the interconnection layer 26 has been described above in connection with an integrated circuit package that includes solder bumps 22, other arrangements are possible. For example, FIG. 6 depicts a top surface of a die 40 that includes bond pads 44 for communicating supply voltage to and from the die 40. The interconnection layer may be formed, for example, by metal lines 50, or bonding wire, that connects various bond pads 44 together. For example, the bond pads denoted by the reference numeral "44b" are connected together via the conductive traces 50. Other arrangements are possible.

Figure 8:
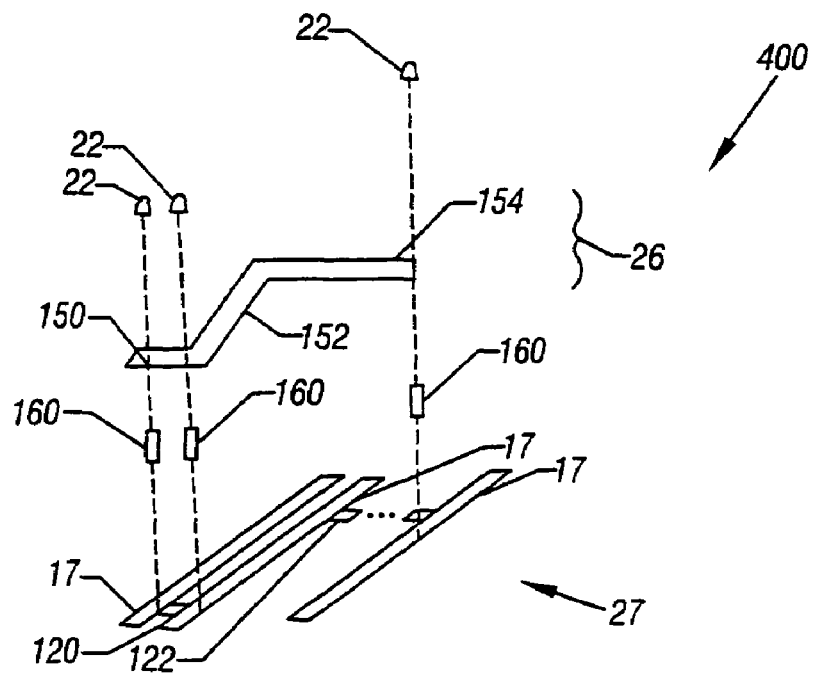
FIGS. 8, 9 and 10 are exploded perspective views of portions of semiconductor packages according to different embodiments of the invention.

FIG. 8 depicts an integrated circuit package 400 in which the interconnection layer 26 is formed from conductive traces 150, 152 and 154, all of which lie in the same metal layer. Vertical vias 160 form connections between the traces 150, 152 and 154 and the associated buses 17.

Figure 9:
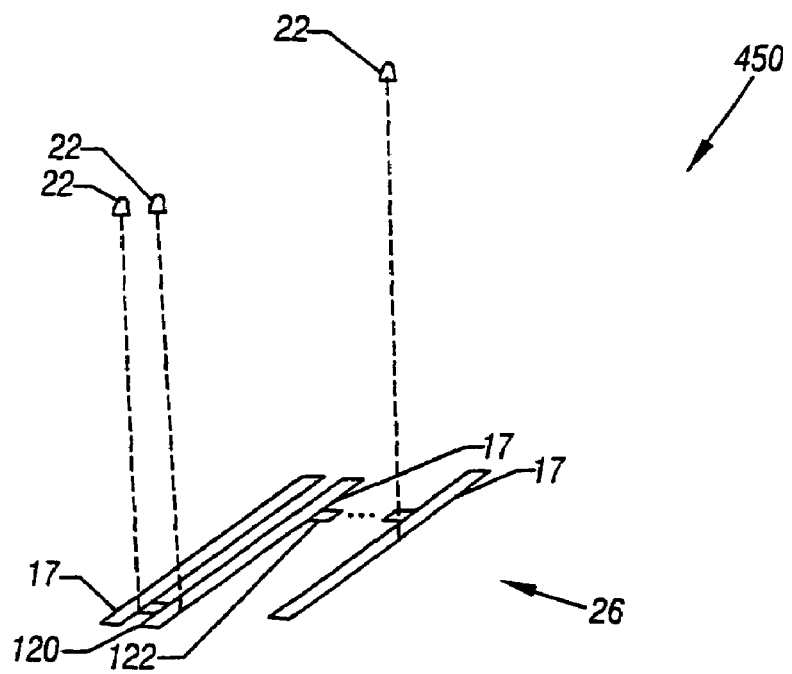

FIG. 9 depicts an integrated circuit package 450 in which the interconnection layer 26 is formed in the same metal layer as the buses 17. For example, in some embodiments of the invention, the interconnection layer 26 may be formed by a conductive trace 120 that connects two of the buses 17 together, and another conductive trace 122 that connects the other bus 17 to the two connected buses. Other arrangements are possible.

Figure 10:
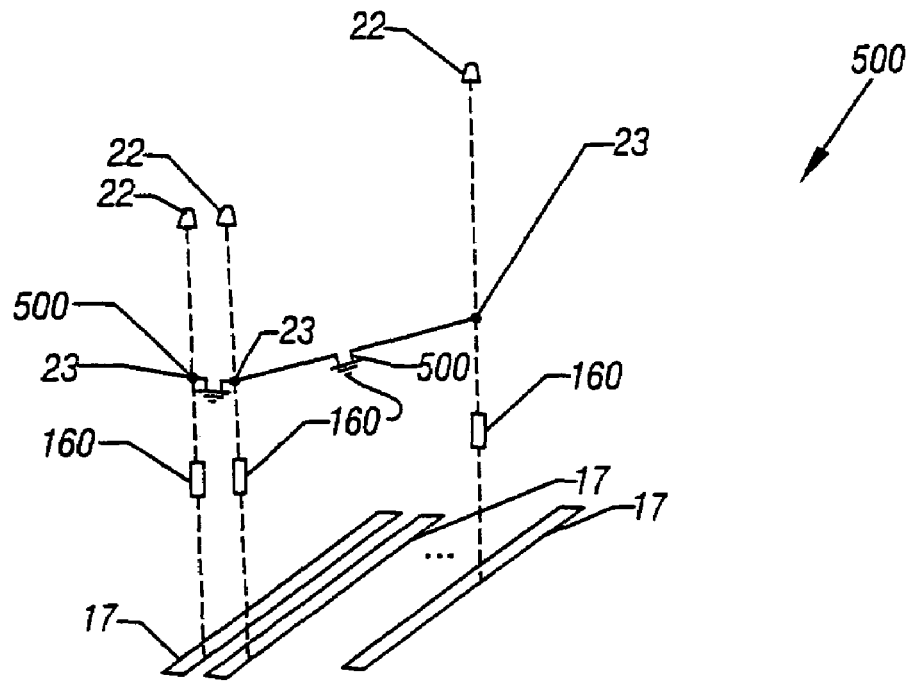

FIG. 10 depicts another integrated circuit package 500. In the package 500, the interconnection layer 26 contains circuitry other than hard-wired conductive traces. In this manner, in some embodiments of the invention, the interconnection layer 26 may include switches, such as metal-oxide-semiconductor field-effect-transistors (MOSFETs) 500, that have their drain-source paths coupled between various solder bumps 22 to selectively form connection points 23 near the solder bumps 22. Thus, due to this arrangement, the MOSFETs 500 may be selectively closed to couple groups of the solder bumps 22 together. This arrangement may have various advantages, such as permitting grouping of the solder bumps 22 after fabrication of a particular integrated circuit. In this manner, it may be determined that certain solder bumps 22 require higher current densities than other solder bumps 22. Thus, the solder bumps 22 that require higher densities are connected together to effectively impart a higher current carrying capability to each of these bumps 22.

Figure 11:
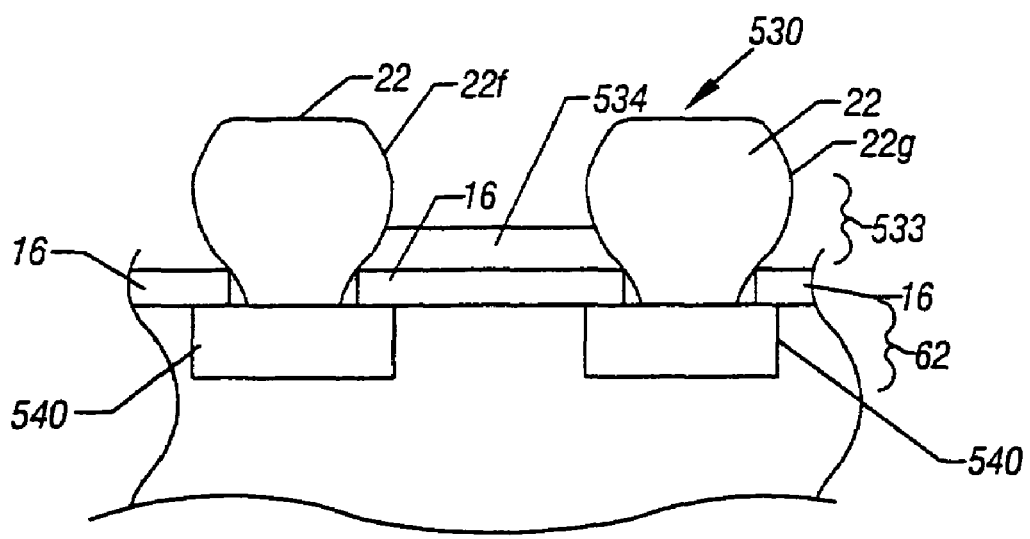
FIG. 11 is a cross-sectional view of a portion of a semiconductor package according to an embodiment of the invention.

Other embodiments are within the scope of the following claims. For example, FIG. 11 depicts an arrangement in which an extra metal layer 533 (a metal seven layer, for example) is created on top of the passivation layer 16 (i.e., on the opposite side of the passivation layer 16 from the other metal layers) for purposes of forming part or all of the interconnection layer 26. In this manner, the metal for the metal layer 533 may be deposited on top of the passivation layer 16. Next, a mask is used to form an etching pattern for purposes of permitting subsequent etching to remove metal from the metal layer 533 while leaving conductive traces (the trace 534 depicted in FIG. 11, as an example) to selectively form connections between the solder bumps 22. As depicted in FIG. 11, in an example, two solder bumps 22f and 22g are connected together by a conductive trace 534 of the metal layer 533. The solder bumps 22f and 22g extend through respective windows to contact respective metal pads 540 of the next lower metal layer 62. Other variations are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electrical device comprising:
   electrical contact pads to receive a supply voltage;
   a power bus electrically connected to the electrical contact pads; and
   an interconnection circuit to, for each electrical contact pad, form a redundant connection between the bus and the electrical contact pad,
   wherein the electrical device comprises a semiconductor device comprising having multiple process layers, and
   the interconnection circuit is formed in the same process layer as the power bus.

2. The electrical device of claim 1, wherein the electrical device comprises a microprocessor.

3. The electrical device of claim 1, wherein the electrical contact pads comprise solder bumps.

4. The electrical device of claim 1, wherein the electrical contact pads comprise bond pads.

5. A method usable with a semiconductor device, comprising:
   electrical connecting external contacts of a semiconductor device to internal buses of the semiconductor device;
   establishing redundant connections between the buses and the external contacts;
   forming the buses in a first process layer; and
   forming the redundant connections in the same first process layer.

6. The electrical device of claim 5, wherein the semiconductor device comprises a microprocessor.

7. The electrical device of claim 5, wherein the external contacts comprise solder bumps.

8. The electrical device of claim 5, wherein the electrical contact pads comprise bond pads.

* * * * *